SEMICONDUCTOR RESISTANCE ELEMENT

Filed May 11, 1959

INVENTOR
R. M. WARNER, JR.
BY
ATTORNEY

United States Patent Office 2,989,713

Patented June 20, 1961

2,989,713
SEMICONDUCTOR RESISTANCE ELEMENT

Raymond M. Warner, Jr., Morris Plains, N.J., assignor to Bell Telephone Laboratories, Incorporated, New York, N.Y., a corporation of New York Filed May 11, 1959, Ser. No. 812,232
4 Claims. (Cl. 338—20)

This invention relates to semiconductor resistance elements and, more particularly, to semiconductor current limiters having a multistep current-voltage characteristic.

This invention is based, in part, on the field effect varistors disclosed in the application of E. I. Doucette, H. A. Stone, Jr. and R. M. Warner, Jr., Serial No. 700,319, filed December 3, 1957, now Patent No. 2,954,486. These devices utilize the current pinch-off effect resulting from depletion layer growth in conjunction with particular structural arrangements to provide a current limiting characteristic.

It is based further on the recognition that by a proper selection of device geometries and the provision of more than one pinch-off region, a single semiconductor device will exhibit a characteristic having several different current limiting levels.

Therefore, an object of this invention is a field effect varistor having new and useful electrical characteristics.

A further object is a field effect varistor having a plurality of different current limiting levels.

A more specific object of this invention is a field effect varistor having specific current limiting levels of successively larger values.

The several forms and embodiments of the devices of this invention are, to some extent, extensions and improvements of the devices of the above-mentioned application of Doucette-Stone-Warner. For example, one form of the device of this invention comprises a wafer of semiconductive material of one conductivity type having a series of transverse striplike regions of the opposite conductivity type and of uniform depth in one major face of the wafer. Thus, the boundaries between the spaced striplike regions and the remainder of the wafer define PN junctions. In the other major face there are provided transverse trenches opposite the striplike regions. Advantageously, these trenches are rectangular in cross section, similar to the structure disclosed in the above-mentioned application of Doucette-Stone-Warner. However, in this instance each trench is of a different depth. As a consequence, the portion of the wafer termed a channel, between the bottom of each trench and its corresponding PN junction has a different thickness. To complete the device, substantially ohmic electrodes are applied to both end faces of the wafer which are generally parallel to the disposition of the trenches and striplike regions.

Thus, in the device described, upon application of a voltage producing a current flow through the device, current pinch-off as described in the above-mentioned application will occur first at the channel of minimum thickness corresponding to the deepest trench. When the voltage has risen to the value corresponding to breakdown for this first channel, the current will again begin to rise as prescribed by the geometry of the next thickest channel region. This rise will continue until pinch-off again occurs for this second channel which will then produce a second level of substantially constant current operation. As in the previous instance, as the voltage rises to breakdown for the second channel, the limiting characteristic will be repeated at a higher current level. In the reverse direction the device, if of the symmetric or nonpolar type in which each electrode is connected only to a portion of one conductivity type, will exhibit a characteristic which is substantially a point reflection through the origin of the forward characteristic just described. It is at once apparent that the multistep current-voltage characteristic just described is useful particularly in computer applications and the like, where, for example, a specific current level is desired to correspond to a rough analogue voltage.

The device of this invention is useful, likewise, in circuits to perform quantizing operations.

It is apparent from the foregoing that one feature of this invention is a field effect varistor having a plurality of pinch-off channels, each having different dimensional parameters of thickness ($a$), width (Z) and length (L). It is known from the above-noted application of Doucette-Stone-Warner that the current pinch-off level is a function directly of the channel thickness $a$ and the width Z and inversely of the channel length L in the direction of current flow. Thus, in one multistep field effect varistor a succession of different current limiting levels is provided by a plurality of pinch-off channels having different thickness dimensions $a$.

Another field effect varistor in accordance with this invention exhibits a succession of different pinch-off current levels by the provision of pinch-off channels having different widths Z.

A further feature of this invention is a multistep field effect varistor having a succession of different current limiting levels by virtue of a plurality of pinch-off channels of different channel lengths L.

The invention and the above-noted objects and features thereof will be understood more clearly and fully from the following detailed description taken in connection with the drawing in which.

Figure 1:
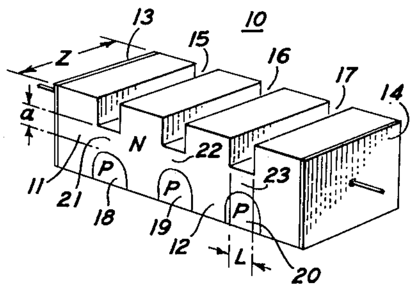
FIG. 1 is a perspective view, partially in section, of a multistep field effect varistor illustrating one form of this invention.

The field effect varistor of FIG. 1 comprises a silicon wafer, whose bulk is N-type, having trenches 15, 16 and 17 regularly spaced in the upper face thereof. In the lower face of the wafer, three striplike regions of P-type conductivity 18, 19 and 20 are provided opposite the three trenches. The P-type regions 18, 19 and 20 are uniform. The trenches, however, are of different depths. As shown, trench 15 is the deepest trench, trench 16 slightly less deep, and trench 17 the shallowest of the three. Thus, the thickness of the portions 21, 22 and 23 intermediate the trenches and the P-type regions, referred to as the channels, vary from the thinnest channel 21 to the thickest channel 23. The end portions of the wafer are plated and leads are attached thereto to provide low resistance electrodes 13 and 14.

Figure 2:
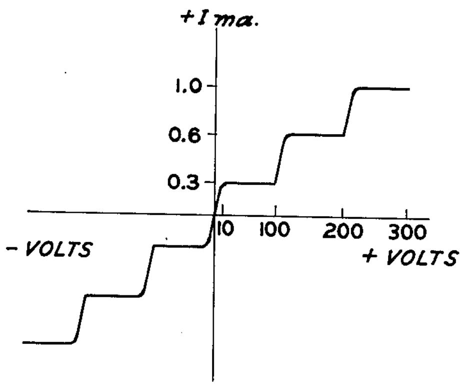
FIG. 2 is a graph showing the current-voltage characteristic for the device of FIG. 1.

A specific varistor of the kind shown in FIG. 1 will exhibit the current-voltage characteristic substantially as shown in the graph of FIG. 2 when connected in series with a suitable load. Thus, with the application of a steadily increasing voltage across the terminals of the device, the current will rise from a zero value until the applied voltage reaches a value of 10 volts. During this rise the depletion layer associated with the thinnest channel 21 will increase until it reaches the bottom of the trench 15 representing the pinch-off condition for this channel. From this point the current is limited by the action of this channel region to about the 0.3 milliampere level and this condition obtains until the voltage reaches the avalanche breakdown value for the junction associated with this channel, at about 100 volts. From this point, the current again rises as the depletion layer of the next thinnest channel 22 increases until pinch-off is reached in this channel, at a total applied voltage across the electrodes 13 and 14 of about 110 volts. Again, the device exhibits a constant current condition at about 0.6 milliampere until the avalanche breakdown voltage is reached for the junction associated with the channel region 22. Likewise, the same sequence occurs in connection with the thickest channel 23 which limits current at a value of about one milliampere and 210 volts. In the device described the pinch-off current is a function primarily of the relative thicknesses of the several channel regions provided in the device. It is apparent that under the conditions described the particular sequential arrangement of the channel regions does not affect the characteristic.

An exemplary fabrication of a device having a characteristic of the kind typified by the graph of FIG. 2 includes, first, the provision of a wafer of single crystal silicon having a resistivity of about 50 ohm centimeters, N-type, which is a comparatively high resistivity material. Typically, the wafer has a length of 0.1 inch, a width of 0.05 inch and a thickness of 0.003 inch. The P-type conductivity regions 18, 19 and 20 are produced in one face of the wafer by masking the wafer using photoresist and oxide film masks, for example, in accordance with the methods disclosed in the application of J. Andrus, Serial No. 678,411, filed August 15, 1957. The wafer is placed in a tubular furnace and heated at a temperature of 1300 degrees centigrade in a flow of a mixture of boron trioxide and nitrogen for a period of one and one-quarter hours to enable a penetration of 0.001 inch for the regions 18, 19 and 20.

The wafer is then cleaned of any masking material and the trenches are cut to varying depths in the opposite face of the wafer. This is done either by etching or by a combination of ultrasonic cutting and etching.

Specifically, in one process all the trenches may be cut initially to a depth of .0014 inch and a trench width of .005 inch. The trench width corresponds to the channel length L. The wafer, except for the trenches themselves, is then covered with an etch resistant mask, specifically, of Apiezon W wax. The wafer is then exposed to an etchant bath of nitric and hydrofluoric acids in dilute concentration, for example, a ten to one volume mixture, respectively, for a period of 45 seconds which removes 0.00015 inch of material and deepens the trenches to a depth of 0.00155 inch. At this juncture the trench 17 is covered with a wax mask to prevent further etching. The trenches 15 and 16 are further etched for 15 seconds to increase the depth to 0.0016 inch. Trench 16 is then masked and trench 15 is etched another 30 seconds to a depth of 0.0017 inch. Thus, the channel region 21 has a final thickness between the P-type region and the bottom of the trench of 0.0003 inch, channel region 22 of 0.0004 inch and channel 23 of 0.00045 inch. Finally, the end portions of the wafer are suitably plated and leads attached to provide the substantially ohmic electrode connections 13 and 14. For added clarity in FIG. 1, the channel thickness *a*, channel width Z and channel length L have been specifically denoted.

Figure 7:
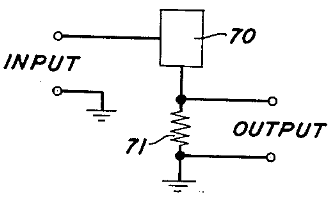
FIG. 7 is a schematic circuit diagram illustrating one application of the multistep field effect varistor.

The usefulness of a device such as described in connection with FIG. 1 is apparent from the characteristic depicted in FIG. 2. For example, in certain signal translating apparatus such as logic elements, it is often desirable to provide a rather precise voltage output in response to relatively coarse voltage inputs. Such a discriminating arrangement is shown in simplified schematic form in FIG. 7 in which a voltage input to the multistep field effect varistor 70 produces a substantially constant current output through the load resistor 71 across which there is exhibited a well-defined voltage output. More specifically, with a voltage input of from approximately 110 to 200 volts, the output current will remain constant at about 0.6 milliampere, which with a load resistor of 10,000 ohms will provide an output voltage of six volts.

Figure 3:
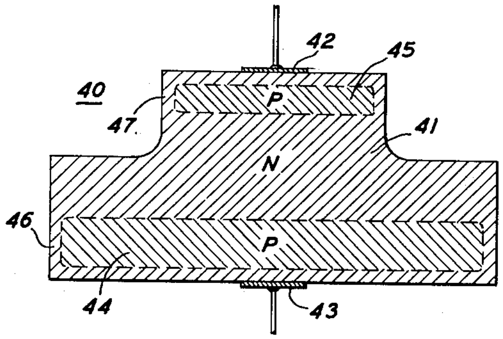
FIGS. 3 and 4 are schematic sectional views illustrating other forms of the invention.

Turning now to the device illustrated in FIG. 3, there is shown a multistep field effect varistor in which the level of the several current limiting steps is determined by a difference in the channel width Z of the several channel regions. As noted hereinbefore, the pinch-off current is dependent directly upon the channel thickness *a* and the width Z of the channel and inversely upon the channel length L in the direction of current flow.

The device of FIG. 3, which has circular symmetry comprises a disc of N-type silicon material 41 having P-type regions 44 and 45 produced therein by diffusion to a uniform depth followed by an etching operation to reduce the diameter of one portion of the device, followed, in turn, by a diffusion of an N-type impurity to produce an N-type layer over the entire wafer. Thus, the pinch-off channel regions comprise the peripheral annular layers 46 and 47 surrounding the P-type regions 44 and 45. From the relation given above it will be seen that the current will limit, first, in the annular channel 47 which defines the smaller Z dimension and then in the annular channel 46 which defines the greater Z dimension, thereby producing a two-step current-voltage characteristic.

Figure 4:
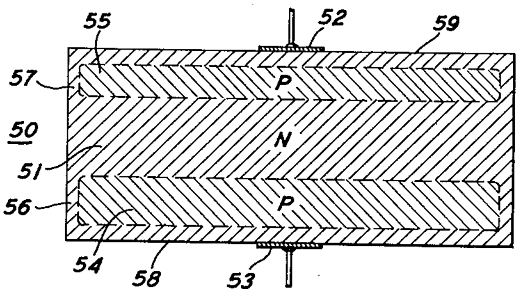

The field effect varistor of circular symmetry shown in FIG. 4 illustrates a variation of the channel length L as between two pinch-off regions. Here again, starting with an N-type silicon wafer, diffusion of a P-type impurity is begun, first, from the lower face 58 and then later from the upper face 59 as well, so as to result in a deeper penetration and a thicker P-type region 54 as compared to the P-type region 55. Subsequently, the entire wafer is subjected to an N-type diffusion to provide a thin N-type skin over the entire wafer. Thus, the channel regions are represented by the N-type annular portions 56 and 57 of the same peripheral length but in which the length in the direction of current flow is greater for the region 56 than for the region 57, thus providing pinch-off in the longer channel region 56 at a lower current value than for channel region 57. Similarly to the device of FIG. 3, this device exhibits a two-step characteristic.

Figure 5:
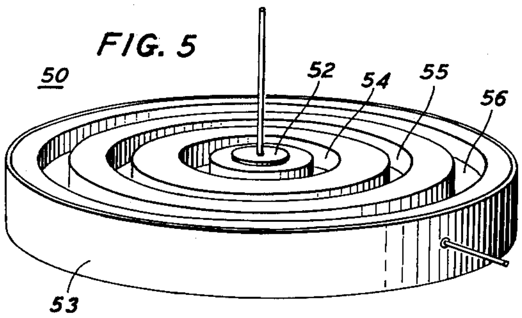
FIGS. 5 and 6 are, respectively, perspective and sectional views of a further embodiment of the invention.
Figure 6:
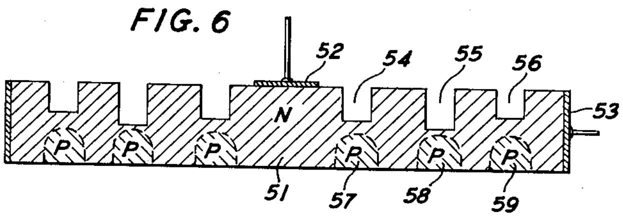

In the multistep field effect varistor illustrated in FIGS. 5 and 6, two parameters are varied to provide the multistep characteristic. This device is likewise a disc of high resistivity silicon material of N-type conductivity having in one face a series of annular diffused P-type regions 57, 58 and 59 of identical depth. In the opposite face of the disc and in registration with the diffused rings, there are provided annular trenches 54, 55 and 56 of different depths so as to provide current limiting channels of different thicknesses. Substantially ohmic electrodes are applied, one electrode 52 to the central portion of the disc and another electrode 53 to the periphery of the disc. It is apparent that in addition to an adjustment of the current limiting steps as a result of different channel thicknesses, the device of FIGS. 5 and 6 provides also a variation in the current-voltage characteristic as a result of the different channel widths $Z_1$, $Z_2$ and $Z_3$ determined by the circumstances of the respective trenches 54, 55 and 56.

It will be apparent also from the foregoing discussion that a device may be produced in which the length L for each channel differs by providing trenches of different widths and therefore that considerable flexibility is possible in providing a multistep field effect varistor having desired current-voltage characteristics. For example, the device of FIG. 1 can be made with trenches of uniform depth but of different widths, thereby providing channel regions of identical thickness but of different lengths L in the direction of current flow. Furthermore, the same basic form of device may be provided having uniform channel thicknesses *a* and lengths L but different widths Z by making either, or both, the trenches and striplike P-type regions of different lengths. One possible form of wafer providing different channel widths Z is wedge-shaped so as to taper in width from one electrode to the other.

Further, it will be understood that multistep field effect varistors can be fabricated which do not involve trenches, or the like, but rely upon a PN junction closely adjacent to a major surface of the body or to another PN junction to provide a channel portion of small cross section. Moreover, it is within the contemplation of this invention to determine the current pinch-off level in each channel region by providing different values of resistivity or concentration gradients, for example, by means of differential diffusion techniques.

The devices described herein have all been shown in terms of individual rectifying junctions defining individual current limiting channels. In such structures the pinch-off condition is a function almost entirely of the geometry and structure of the specific channel region in which pinch-off is occurring. Multistep devices are also possible using a single extended junction which is common to all channel regions. However, in such a structure because the successive pinch-off conditions are affected by the growth of a depletion region which extends along the entire junction, this added complexity introduces limitations in the nicety with which the current-voltage characteristic may be predicted and controlled.

The multistep field effect varistors specifically disclosed thus far are of the nonpolar type which exhibit a comparable characteristic in both directions of applied voltage. It is possible, of course, to fabricate a polar multistep device by each of the channel forming conductivity-type regions with one of the two main electrodes, which then may be referred to as the source electrode in conformity with field effect device terminology. However, since the application of a voltage in the reverse direction results in substantially a short circuit, a similar result can be achieved by shunting a nonpolar device with a suitable diode.

It is to be understood that the specific embodiments of the invention shown and described are but illustrative and that various modifications may be made therein without departing from the scope and spirit of the invention.

What is claimed is:

1. A two-terminal nonlinear multistep resistance element comprising a semiconductive body of substantially one conductivity type having two major surfaces, said body having a plurality of substantially parallel strip-like regions of opposite conductivity type in one major surface and of uniform penetration therefrom, said other major surface having therein a plurality of substantially parallel trenches in opposed relation to said strip-like regions of opposite conductivity type, the boundary between each said trench and each corresponding region of opposite conductivity type defining a current limiting channel, said current limiting channel being characterized by dimensional parameters of length, width and thickness, said channels differing from each other in at least one of said dimensional parameters, a first low resistance electrode contacting said body at least over the portion of one conductivity type and a second low resistance electrode contacting only a portion of said one conductivity type, said second electrode being spaced apart from said first electrode by the interposition of all of said current limiting channels.

2. A two-terminal nonlinear multistep resistance element in accordance with claim 1 in which the thickness dimension of the regions of reduced cross section is the only parameter which differs substantially therebetween.

3. A two-terminal nonlinear multistep resistance element in accordance with claim 1 in which the width dimension of the regions of reduced cross section is the only parameter which differs substantially therebetween.

4. A two-terminal nonlinear multistep resistance element in accordance with claim 1 in which the length dimension of the regions of reduced cross section is the only parameter which differs substantially therebetween.

References Cited in the file of this patent

UNITED STATES PATENTS

| | | |
|---|---|---|
| 2,502,479 | Pearson et al. | Apr. 4, 1950 |
| 2,623,102 | Shockley | Dec. 23, 1952 |
| 2,663,830 | Oliver | Dec. 22, 1953 |
| 2,754,431 | Johnson | July 10, 1956 |
| 2,767,358 | Early | Oct. 16, 1956 |
| 2,869,055 | Noyce | Jan. 13, 1959 |